US008860344B2

United States Patent
Andersen

(10) Patent No.: US 8,860,344 B2
(45) Date of Patent: Oct. 14, 2014

(54) METHOD FOR IMPLEMENTING BOOTSTRAP-SUPPLY CHARGING IN A MOTOR CONTROLLER AT ENERGIZED MOTOR AND MOTOR CONTROLLER USING SUCH A METHOD

(75) Inventor: Henrik Rosendal Andersen, Graasten (DK)

(73) Assignee: Danfoss Drives A/S, Graasten (DK)

( * ) Notice: Subject to any disclaimer, the term of this patent is extended or adjusted under 35 U.S.C. 154(b) by 254 days.

(21) Appl. No.: 13/577,718

(22) PCT Filed: Feb. 18, 2011

(86) PCT No.: PCT/DK2011/000009
§ 371 (c)(1),
(2), (4) Date: Oct. 26, 2012

(87) PCT Pub. No.: WO2011/100971
PCT Pub. Date: Aug. 25, 2011

(65) Prior Publication Data
US 2013/0038259 A1      Feb. 14, 2013

(30) Foreign Application Priority Data

Feb. 18, 2010   (DK) .................................. 2010 00136

(51) Int. Cl.
| | | |
|---|---|---|
| H02P 6/14 | (2006.01) | |
| H03K 17/567 | (2006.01) | |
| H02P 6/20 | (2006.01) | |
| H02P 1/02 | (2006.01) | |
| H02P 27/08 | (2006.01) | |
| H02P 6/18 | (2006.01) | |

(52) U.S. Cl.
CPC ................ *H03K 17/567* (2013.01); *H02P 6/20* (2013.01); *H02P 1/029* (2013.01); *H02P 27/08* (2013.01); *H03K 2217/0081* (2013.01); *H02P 6/18* (2013.01)

USPC ............. 318/400.28; 318/400.26; 318/400.05

(58) Field of Classification Search
USPC .......... 318/400.28, 400.26, 563, 400.05, 801, 318/400.35, 400.32, 400.21, 400.3, 400.02, 318/400.01
See application file for complete search history.

(56) References Cited

U.S. PATENT DOCUMENTS

| 6,570,353 B2 | 5/2003 | Krotsch et al. | |
| 2013/0200829 A1* | 8/2013 | Won et al. ................ | 318/400.26 |

FOREIGN PATENT DOCUMENTS

| EP | 1 914 873 A1 | 4/2008 |
| JP | 7-15978 A | 1/1995 |
| JP | 2001-157459 A | 6/2001 |
| JP | 2001-211654 A | 8/2001 |
| JP | 2007-116826 A | 5/2007 |

OTHER PUBLICATIONS

Thogersen, et al. "Stator Flux Oriented Asynchronous Vector Modulation for AC-Drives". Institute of Energy Technology, Aalborg University, Pontoppidanstraede 101, DK-9220 Aalborg Oest, Denmark, 1990—IEEE, pp. 641-648.
International search report for PCT/DK2011/000009 dated Jan. 14, 2013.

\* cited by examiner

*Primary Examiner* — Karen Masih
(74) *Attorney, Agent, or Firm* — McCormick, Paulding & Huber LLP

(57) ABSTRACT

The present invention relates to a motor controller employing bootstrap-capacitor supplies and in particular to the situation where the bootstrap supplies have to be charged, while the motor controller is connected to a spinning and energized motor. The present invention introduces a method of recharging based on choosing a recharging sequence from a set of recharging sequences, where the choice depends on the state of the connected motor and in particular on the back-EMF voltages of the motor.

14 Claims, 3 Drawing Sheets

METHOD FOR IMPLEMENTING BOOTSTRAP-SUPPLY CHARGING IN A MOTOR CONTROLLER AT ENERGIZED MOTOR AND MOTOR CONTROLLER USING SUCH A METHOD

CROSS REFERENCE TO RELATED APPLICATIONS

This application is entitled to the benefit of and incorporates by reference essential subject matter disclosed in International Patent Application No. PCT/DK2011/000009 filed on Feb. 18, 2011 and Danish Patent Application No. PA 2010 00136 filed Feb. 18, 2010.

TECHNICAL FIELD

The present invention relates to a motor controller with inoperative switches employing bootstrap-capacitor supplies and in particular to the situation where the bootstrap supplies have to be charged while the motor controller is connected to a spinning and energized motor. The present invention introduces a method of recharging based on choosing a recharging sequence from a set of recharging sequences, where the choice depends on the state of the connected motor and in particular on the back-EMF voltages of the motor.

BACKGROUND

A typical motor controller employs a rectifier part and an inverter part, where the rectifier converts multi-phase input voltages to a DC voltage. The inverter typically provides a bridge structure of diodes and transistors forming switching elements, where each of these switching elements includes a high-side and a low-side.

Gate drives are connected to turn on and off the switching elements, where each gate drive requires a voltage supply.

Low-cost commercial motor controllers often employ bootstrap-capacitor supplies of the gate drives for the high-side switching elements in the inverter. This is a cost-effective solution that has been on the market for years. Existing motor-controller products from Danfoss Drives A/S including the VLT® 2800 from 1998, the VLT® Automation Drive FC 30× from 2004 and the VLT® Micro Drive FC 51 from 2007, all utilize the bootstrap-capacitor principle. The method is to turn on the low-side switching element for a time period referred to as the bootstrap-charge time in a given phase for charging the bootstrap capacitor of this phase.

By turning on a low-side switching element the voltage reference of the corresponding high-side gate driver is being connected to the voltage reference of the low-side switching element, meaning that energy from a low-side DC voltage supply can be transferred to the corresponding bootstrap capacitor, typically, but not necessarily, via a current-limiting bootstrap resistor and a high-voltage diode.

Then, when the low-side switching element is off, the high-side bootstrap capacitor holds the needed energy for the high-side gate driver until the next on-state of the low-side switching element. This period is referred to as the hold-up time of the bootstrap capacitor in a given phase which together with the load current from the high-side gate driver and the minimum tolerated level of the high-side supply voltage, defines the required bootstrap capacitance.

The required bootstrap capacitance and the needed current-limiting-bootstrap resistor set the bootstrap-charge time, which should be as small as possible to have minimum impact on the motor-controller performance.

A desirable long hold-up time and a desirable short bootstrap-charge time essentially contradict each other.

Until the bootstrap capacitors are charged, the high-side switching elements will be inoperative (off), since the corresponding gate drives are without voltage supply.

Conventionally, the charging of the high-side gate drives is simple. At standstill, the low-side switching elements are turned on, and at the end of the bootstrap-charge time, the whole inverter may be started with all switching elements operative using normal PWM (Pulse Width Modulation), as for example described in the paper "Stator Flux Oriented Asynchronous Vector Modulation for AC-Drives" presented at the international conference PESC'90. If the drive is not started within the hold-up time of any of the bootstrap capacitors, a new bootstrap-charge period is needed, before normal PWM can be entered.

After a bootstrap when all switching have become operative is entered, the system is in the normal PWM mode where is well known that the bootstrap recharging must run continuously to keep all switching elements operative. The normal PWM must be designed not to violate the hold-up time as given by the bootstrap-capacitor design, which is a constraint when using low-cost bootstrap supplies. A literature example of this is U.S. Pat. No. 6,570,353 B2, describing a starting algorithm of a PM-motor for maintaining operative switching elements after the bootstrap supplies initially were charged by a bootstrap sequence at standstill.

Recharging of the bootstrap supplies is not a major problem at low-speed operation, or start-up, of most motor controllers. For a 3-phase motor controller as in U.S. Pat. No. 6,570,353 B2, all low-side switches will be modulated in every switching period giving short time periods in the off state only at low speed. Hence, all bootstrap capacitors are continuously recharged sufficiently. Problems however may occur at high speed levels, where the well-known overmodulation technique frequently is used to generate a sufficient level of output voltage for the load.

It may happen in a high speed region that in a particular interval in time one of the low-side switches is modulated in two or more subsequent switching periods, with the consequence of an enlarged period of time where the corresponding bootstrap supply is not charged. This time period may risk approaching the hold-up time for the bootstrap supply.

In another high speed region it may happen in a particular interval in time that two low-side switches are modulated in two or more subsequent switching periods, with the consequence of an enlarged period of time where the corresponding two bootstrap supplies are not charged. Again, this time period may challenge the hold-up time of the bootstrap supplies.

In some drives the low-side switching elements are turned on and off (PWM modulated) within the bootstrap-charge time to limit the stress on the motor controller in general, and also to limit the stress on the motor, if it is spinning and energized (magnetized), in this situation operating as a generator inducing voltages on the output terminals of the motor controller, thus inducing the back-EMFs.

Even with a PWM modulated bootstrap-charge period, there may still be induced an over-voltage in the motor controller and/or an over-current in both the motor controller and the motor. For permanent magnet motors this could be destructive. In worst case the bootstrap sequence is equal to a 3-phase short-circuit condition of the spinning motor.

Those skilled in the art may recognize this problem as being highly relevant for a spinning permanent-magnet motor.

SUMMARY

The present invention relates to introducing a method to overcome this problem, and to the device implementing the method.

The present invention mainly relates to a motor controller and a motor, and is exemplified as such, but may apply in general to any controller for a load, where similar problems may occur.

The object of the present invention is to introduce a method to recharge the bootstrap supplies of a motor controller after a coast (hold) situation with inoperative switching elements of the motor controller, where the motor controller comprises at least two output phases, and is connected to a load generating back-EMFs at the output terminals of the motor controller. The method comprises a recharge sequence for each output phase, and selecting each recharge sequence from a set of recharge sequences in relation to the back-EMFs of the load.

In a preferred embodiment the recharging sequences are bootstrap-charging processes.

In a further preferred embodiment the back-EMFs are caused by a spinning motor.

In a further preferred embodiment, the motor is a three-phase motor, the motor controller thus being a three-phase motor controller.

In a further preferred embodiment, a recharging sequence is selected among a set of sequences comprising at least two recharging sequences, where the choice is based on the fraction of the spinning frequency of a motor to a base frequency or the fraction of the actual amplitude of the back-EMFs to a base amplitude of the back-EMFs of the motor. In a preferred embodiment the base frequency and the base amplitude are the rated frequency and rated amplitude of the motor.

In a further preferred embodiment, the set of recharging sequences comprises a high-frequency zone defined as being all spinning frequencies, where the fraction of the spinning frequency of the motor to a base frequency is above an upper threshold spinning level. Alternatively, this zone is defined as where the fraction of the actual amplitude of the back-EMFs to a base amplitude of the back-EMFs of the motor is above an upper threshold voltage level.

In a further preferred embodiment, the set of recharging sequences comprises a low-frequency zone defined as being all spinning frequencies below a lower threshold spinning level of the spinning frequency of the motor to a base frequency, the lower threshold spinning level possible being the same as the upper threshold spinning level. Alternatively, this zone is defined as where the back-EMF amplitude of the motor is lower than a lower threshold voltage level, possibly being the same as the upper threshold voltage level.

In the following, the upper (or lower) threshold in general refers to mean either the upper (or lower) spinning or voltage threshold. Also, when in general referring to the motor spinning above or below a threshold level (upper threshold or lower threshold), it is in general meant that, either the fraction of the spinning frequency of the motor to a base frequency is above or below a threshold spinning level (upper or lower), or alternatively, that the fraction of the actual amplitude of the back-EMFs to a base amplitude of the back-EMFs of the motor is above or below a threshold voltage level (upper or lower), or both.

In a further preferred embodiment, the set of recharging sequences further comprises a medium-frequency zone defined as being in between the low-frequency zone and the high-frequency zone, meaning being in between the upper and lower thresholds.

In a further preferred embodiment, a first sequence of the set of sequences is to initiate the recharging process of all three phases essentially at the same time.

In a further preferred embodiment, a second sequence in the set of sequences is to initiate the recharging process of two phases essentially at the same time, in a preferred embodiment when they both are negative, optionally when they both get below a recharge threshold level essentially being negative (some defined value of the back-EMF voltage), for example when two of the phases have crossed the zero-crossing point, the recharge threshold level thus being zero, or alternatively at the time when they have similar negative back-EMF values. The recharging process of the third phase then in a preferred embodiment is being initiated at its zero-crossing region succeeding the recharging processes of the 2 first phases. Alternatively at any time when it is negative next.

In a further preferred embodiment, a third sequence in the set of sequences is to initiate the charging process of all three phases in succession, when they are with negative back-EMF values respectively, optionally at their zero crossing point or when the individual back-EMFs are lower than a recharge threshold level essentially being negative.

In a further preferred embodiment, the first sequence corresponds to the low zone, the second sequence corresponds to the medium zone and the third sequence corresponds to the high zone.

The invention further relates to a motor controller or a device in general, including any number and permutation of the above embodiments.

As a summarizing remark to the description of the present invention, the bootstrap capacitors are assumed at least partly decharged below a critical threshold (to be defined). T be able to 'catch' the motor the bootstrap capacitors are firstly charged by synchronized bootstrap sequences, thus avoiding (or at least minimizing) problems due to overcurrent and/overvoltage. When the bootstrap capacitors are charged the motor starter is ready to catch the motor safely because all transistors are operative with acceptable levels for the gatevoltage. This is done by a well known start algorithm such as described in U.S. Pat. No. 6,570,353 B2.

DETAILED DESCRIPTION

Figure 1:
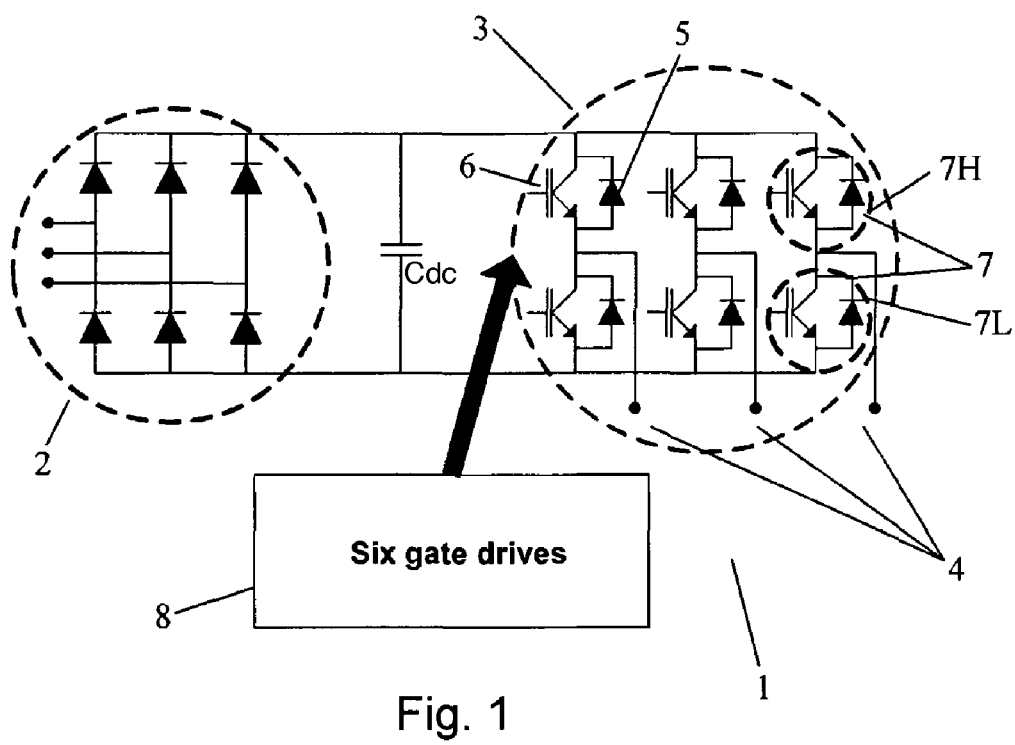
FIG. 1 illustrates one typical controller, where the present invention with advantage may be applied.

FIG. 1 shows a typical set up of a motor controller (1) comprising a rectifier (2) and an inverter (3), both three-phase, where the rectifier (2) changes an AC signal from an AC line into a DC signal being the input to the inverter (3) forming it into a pseudo AC signal running a load/motor (14) connected to the output terminals (4) of the inverter (3). The inverter (3) typically provides a bridge structure of diodes (5) and transistors (6) forming a set of three switches (7), one for each of the three phases, or lines of the motor (14). Each set of these switching elements (7) of the inverter part (3) includes a first subset referred to as the high-side (7H) and a second set referred to as the low-side (7L).

Gate drives (8) are connected to turn on and off the switching elements (7), where each gate drive requires a voltage supply.

Low-cost commercial motor controllers often employ bootstrap capacitor (11) supplies of the gate drives (8) for the high-side switching elements (7H) in the inverter (3). This cost-effective solution has been on the market for years. The method is to turn on the corresponding low-side switching element (7L) for a time period referred to as the bootstrap-charge time to charge the gate drivers for the high-side switching elements.

Figure 2:
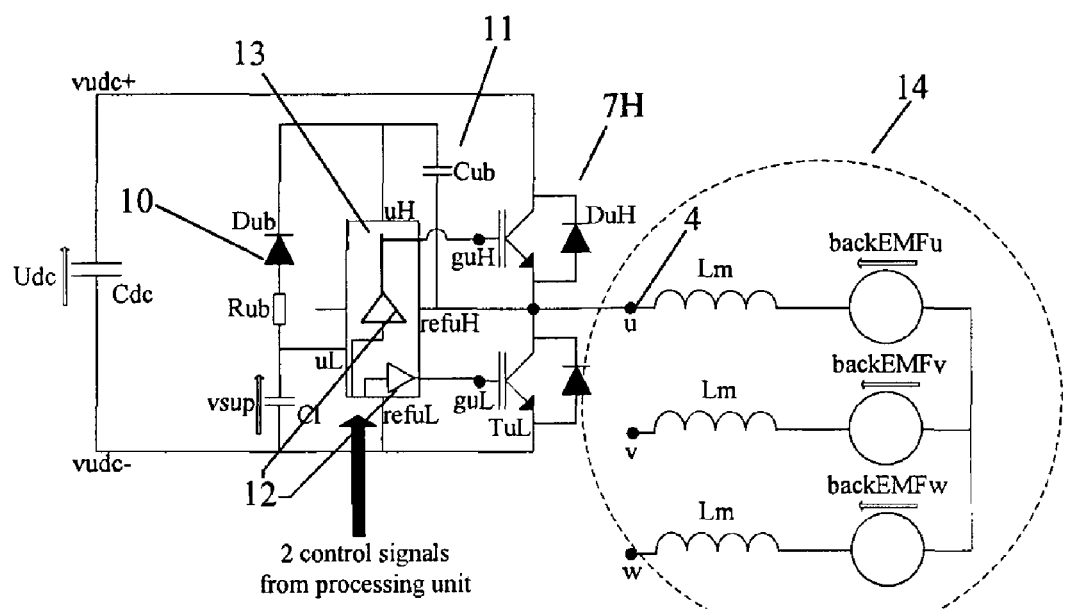
FIG. 2 illustrates the controller with a back-EMF at one of the phases.

FIG. 2 illustrates one general and typical set up of the gate drives (8) showing the situation for one of the phases (u), when a motor generates a back-EMF in this and the other phases. The gate drive (8) illustrated comprises for example a bootstrap diode (10) and a bootstrap capacitor (11) and a level shifter (13) with drivers (12) for the low-side (the low-side driver) and high-side (high-side driver) respectively.

By turning on a low-side switching element (7L) the voltage reference of the corresponding high-side driver (12) is connected to the voltage reference of the low-side switching element (7L), meaning, that energy from a low-side DC voltage supply can be transferred to the high-side bootstrap-supply capacitor (11), typically, but not necessarily, via a resistor (Rub) and a high-voltage diode.

Then, when the low-side switching element (7L) is off, the high-side bootstrap capacitor (11) holds the needed energy for the high-side gate driver (12) until the next on-state of the low-side switching element (7L).

Until the bootstrap capacitors (11) are charged, the high-side switching elements (7H) are inoperative (off), since the corresponding gate drives are without voltage supply.

Conventionally, the charging of the high-side drives (12) is simple. At standstill, the low-side switching elements (7L) are turned on, and at the end of the bootstrap-charge time the whole inverter may be started conventionally with all switching elements operative.

In some drives the low-side switching elements (7L) are turned on and off (PWM modulated) within the bootstrap charge time to limit the stress on the motor controller (1) in general, and also to limit the stress on the motor (14), if it is spinning and energized (magnetized). In this case, the necessary modulation of the low-side switching elements (7L) during the bootstrap-charge time in worst case, is similar to a 3-phase short-circuit condition of the motor, making it obvious why bootstrap charging is problematic on an energized motor. Those skilled in the art may recognize this problem as being typical for a spinning permanent magnet motor.

This bootstrap process thus involves turning on and off the low-side inverter switching elements to power up the high-side gate drives (12) with the high-side switching elements (7H) being off. This leaves the problem, that having a spinning motor (14) being magnetized and thus giving a back-EMF system, then the back-EMF system, the motor inductance per phase Lm, the low-side inverter transistors, the high-side freewheeling inverter diodes and the DC-link capacitor Cdc emulate a boost rectifier, meaning that the DC-link voltage may go too high during the process. An "infinite" loop may be that, the bootstrap sequence itself leads to an overvoltage incident meaning that, the drive cannot be started on the fly. Hence, as may be deduced below, the bootstrap sequence should be synchronized with the back-EMF system to limit the motor current and the energy transfer back to Cdc.

A first demand to the method is to ensure a short bootstrap sequence relative to the fundamental motor period.

A first example relates to a motor with an upper fundamental motor frequency of 500 Hz, giving a minimum fundamental period of 2 ms. Aiming for bootstrap charging when the corresponding back-EMF is low or negative in a given phase, the bootstrap-charge sequence of this phase in one preferred embodiment with advantage is chosen with a maximum to be one half of the smallest fundamental period, which is 1 ms.

In a further preferred embodiment according to this example, it is chosen as in the prior art to PWM modulate the low-side switching element at a 50% duty cycle during the bootstrap sequence, the effective bootstrap-charge time thus being one half of 1 ms, which equals 500 µs.

An example of a bootstrap sequence could then be a low-side switching element modulated at 8 kHz with a 50% duty cycle for a period of 1 ms giving a fairly short on-time of 62.5 µs per switching period relative to the electrical time constant of a typical motor.

As another example, the 1 ms bootstrap-charge time should be compared to a typically desired hold-up time of the bootstrap capacitors in the region of 5 to 10 ms, as may be deduced from evaluating a 50 Hz rated motor fed by over-modulated PWM voltages at for example 45 Hz actual operating frequency (hold-up time>1/(3·45)=7.5 ms). In the following a 10 ms hold-up time is assumed.

Using the above examples, it is the scope of the present invention to provide a method for bootstrap charging minimizing the motor controller and motor stress over a wide range of fundamental motor frequencies, hence covering motors having rated fundamental frequencies in a range such as 50 to 500 Hz.

To visualize the background for the invention some simulations are enclosed for illustration only, as they would depend on the motor and motor-controller design.

The simulated motor is a sinusoidal three-phase permanent magnet motor assumed to have a rated motor frequency of 50 Hz and a rated voltage of 400 Vrms. The motor is assumed to be star-coupled and the stator inductance per phase (Lm) is 10 mH modeling a motor in the range of 1.5 kW. For worst-case considerations, the permanent magnet field of the rotor is assumed to be stronger than the magnetic field induced by the stator currents. Hence, field weakening and impacts of a d-axis current on the back-EMF voltages are neglected. The motor is assumed to be loaded with a large enough moment-of-inertia to maintain a constant speed during the bootstrap-sequence examples considered.

A 1.5 kW three-phase motor controller is assumed to have a DC-link capacitance Cdc of 75 µF (see FIG. 1) and a rated output current level of 4 Arms.

Figure 3:
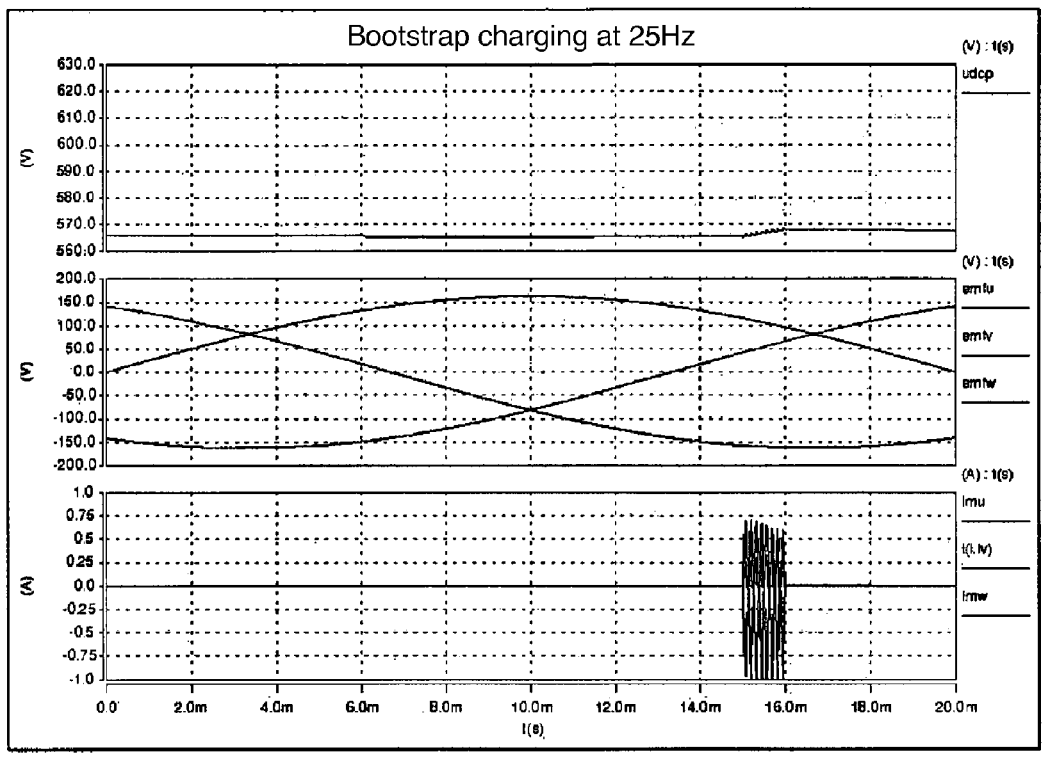
FIGS. 3-6 show different simulations of recharging processes according to the present invention.

In a first example, shown in FIG. 3, the motor is spinning at 25 Hz (medium-to-low speed). Then the same bootstrap sequence in each phase is started at the same time at an arbitrary angle relative to the rotor position of the permanent magnet motor. As may be deduced, the simplest approach of modulating all low-side transistors synchronized and in phase is used giving the shortest duration of the 3 bootstrap sequences. FIG. 3 shows the simulated DC-link voltage Udcp, the back-EMF voltages emfx and the motor currents imx.

Figure 4:
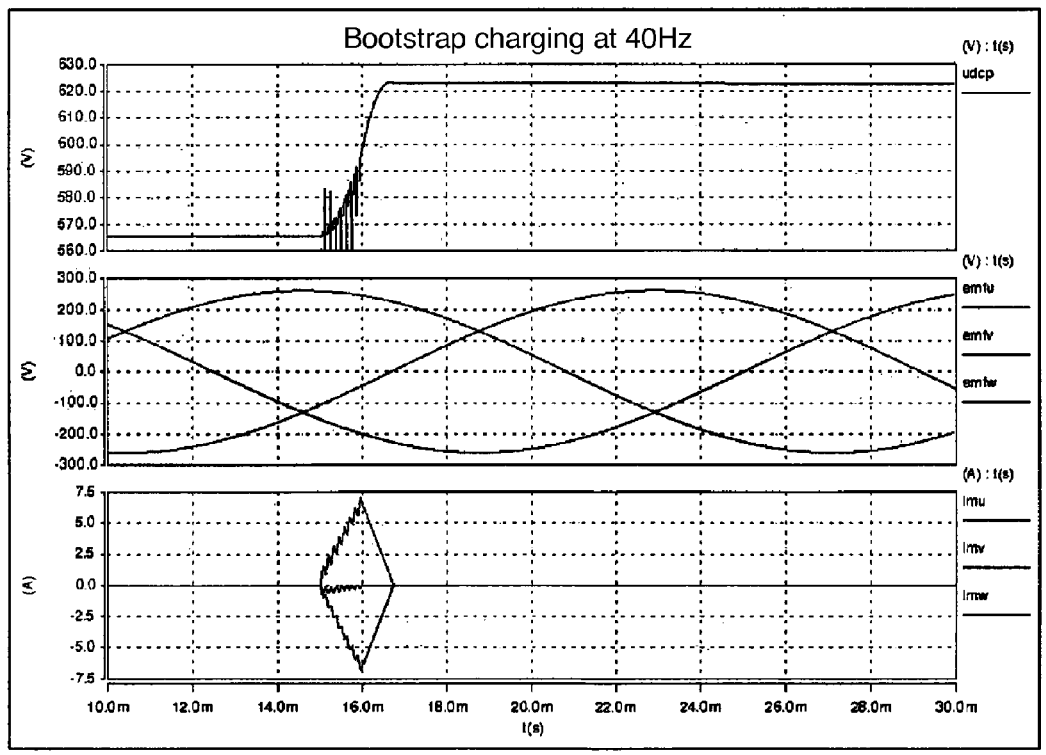

In another example with a higher spin rate of the motor, roughly at 40 Hz (high speed defined to be close to the rated motor frequency of 50 Hz), the above simplest bootstrap-sequence approach is repeated in FIG. 4. The difference between a 25 Hz speed level and a 40 Hz speed level is the back-EMF. At 25 Hz the back-EMF is 0.5·400=200 Vrms. At 40 Hz the back-EMF is 400·4/5=320 Vrms. At a fixed bootstrap sequence this means less motor current and less energy transfer back to Cdc at 25 Hz. Another important difference is the difference between the initial DC-link voltage and the back-EMF system. If the voltages are almost the same, which is the case at high speed levels, there is a limited voltage across the motor ("Boost") inductance Lm during the off states of the low-side inverter switching elements. Hence, the discharge of the motor phase currents goes sluggish compared to the charge states, where the low-side ("Boost") transistors are on, giving a 3-phase short-circuit of the back-EMF system. This leads to continuous motor currents (see FIG. 4), which maximizes the energy transfer back to Cdc. In FIG. 4 something like full output power is fed back to the DC-link during the bootstrap sequence. Comparing FIGS. 3 and 4 it is observed that the DC-link is charged a few Volts at 25 Hz, while the discontinuous motor currents are up to 1 A. This is around 20% of the rated output drive current. In FIG. 4 the DC-link is charged substantially from 566V to around 625V, which is around 60V. This is a bad situation in terms of overvoltage tripping. Even worse, the continuous motor currents are up to 7.5 A, which is around 130% of rated output drive current. This is in the over-current range of the motor controller, and may be harmful to the PM-motor, since the induced stator magnetic field is in anti-phase with the permanent magnetic field of the rotor.

According to simulation, the phase of the 1 ms bootstrap sequence relative to the back-EMF system (rotor position of permanent magnet motor) is not changing the impact substantially in FIGS. 3 and 4. FIG. 3 is an acceptable performance, whereas FIG. 4 is unacceptable. Hence, a change is needed, especially at high-frequency levels, defined here as being larger than 50% of rated speed. It may be observed that a given impact per phase is substantially reduced, if the bootstrap sequence of said phase is executed, while the back-EMF of said phase is negative. This calls for a synchronized bootstrap sequence, which cannot be executed at the same time in each phase.

Figure 5:
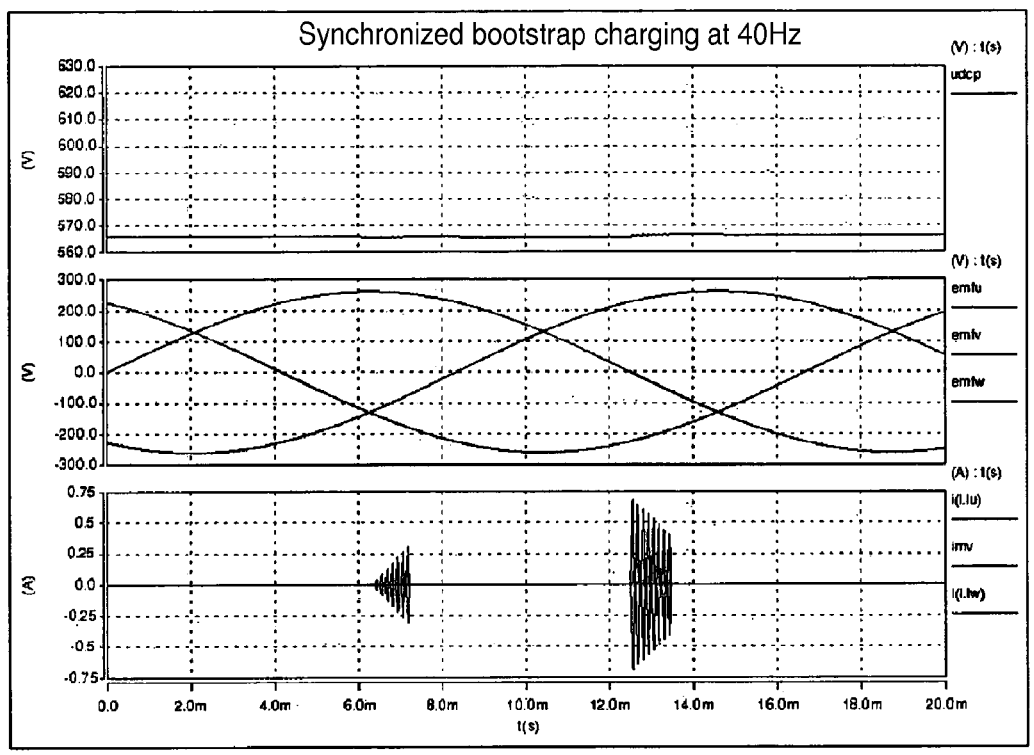

FIG. 5 shows a solution leading to negligible charging of the DC-link and acceptably low motor currents in the high-frequency region, at a rated motor frequency of 50 Hz. The bootstrap sequences of 2 phases are executed at the same time and in phase, when the back-EMFs of these phases cross, while both being negative. Then the bootstrap sequence of the third phase is initiated at the first negative-going zero crossing of the back-EMF of this phase. An important parameter is the delay between the first 2 phases and the third phase, as this period should be smaller than the hold-up time of 10 ms in order for the principle to be useful. The delay is 90°, meaning that the principle makes sense down to a fundamental frequency of approximately 25 Hz. In the given example the fundamental frequency is 40 Hz, giving a delay of 6.25 ms, which is below the hold-up time.

Figure 6:
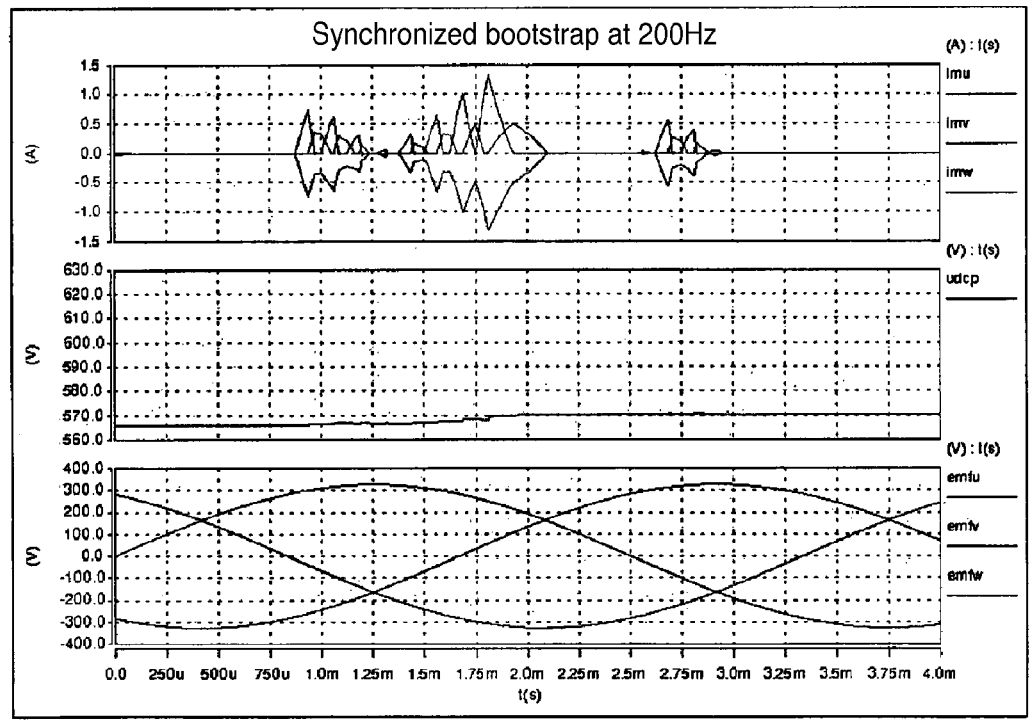

Using the principle in FIG. 5 at a rated motor frequency of 200 Hz is not preferable. The bootstrap sequences of the 2 first phases last for 1 ms, but the 2 corresponding back-EMFs are negative both during 30° only, which is 0.42 ms at 200 Hz. A solution is to initiate the bootstrap sequence of the first 2 phases 30° earlier than in FIG. 5. This leaves an interval of 60°, which is 0.83 ms at 200 Hz, for the bootstrap sequence of these phases. This is at the edge as may be deduced from FIG. 6. Needing an even higher rated motor frequency, the bootstrap sequences of the 3 phases should be started at 3 different time instants. Each time instant is at a negative-going zero-crossing of the corresponding back-EMF. This enables a rated motor frequency of 500 Hz to be supported, at a pulse-train duration of 1 ms. At a high frequency level this can be done without violating the hold-up time, since the time period between the first and the last bootstrap sequence is short enough.

Based on these observations, a principle for the bootstrap-charging process may be defined where different bootstrap strategies are introduced depending on the spinning frequency of the motor relative to the rated motor frequency, where the different charging, or recharging, processes or sequences, defines a set of sequences.

Especially, one may define a low-frequency, a medium-frequency and a high-frequency spinning frequency zone of the motor, being a span of spinning frequencies, and for each of these 'zones' defining a different bootstrap strategy. Since, back-EMF voltage level and frequency are coupled linearly the same zones can be defined in terms of voltage instead of frequency.

For the low-frequency zone, the bootstrap sequences (in the following referred to as the first sequence of the set of sequences) of all three phases may be initiated essentially at the same time at a time where two of the phases have a negative back-EMF. In one embodiment the bootstrap sequences are initiated, when the two phases have the same negative back-EMF, corresponding to the time, when the third phase has the highest positive back-EMF. In an alternative embodiment the bootstrap sequences are initiated at the negative zero crossing of the corresponding back-EMF of one of the phases. In a third embodiment the 3 sequences are initiated essentially at the same time independently on the back-EMFs of the load.

For a medium-frequency zone, the bootstrap sequences (in the following this is referred to as the second sequence of the set of sequences) could be initiated for two of the phases at a time, where they have a negative back-EMF, again in one preferred embodiment the bootstrap sequences are initiated, when the two phases have the same negative back-EMF, corresponding to the time, when the third phase has the highest positive back-EMF. In an alternative embodiment, the bootstrap sequence for two of the phases are initiated, as both back-EMFs are negative, at the negative-going zero crossing of the corresponding back-EMF of one of the two phases. The bootstrap sequence of the third phase is initiated at a negative back-EMF, preferably at the negative-going zero crossing.

For a high-frequency zone, the bootstrap sequences of each phase then could be initiated, preferably in succession, when each of the back-EMFs of the respectively phases are negative, preferably at the negative-going zero crossings (in the following this is referred to as the third sequence of the set of sequences).

The high-frequency zone may be defined as the motor operating above an upper threshold value.

The medium-frequency zone may be defined as being below the upper threshold value and optionally above a lower threshold value of the spinning frequency of the motor to a base frequency.

The low-frequency zone may be defined as being below the upper threshold value and optionally also below the lower threshold value (being either the upper spinning or voltage threshold).

The zones in a non-limiting example could be defined with the low-frequency zone being below 50% and the high-frequency zone being above 75%. Other fractions would also apply to the present invention.

The invention is not limited to defining three zones but could instead be limited to two zones for some systems, each of the two zones implementing one of the three bootstrap sequences as defined above.

However, the definitions of the zones would typically depend on the rated motor frequency.

For example for a rated motor frequency=150-500 Hz, the 1 ms bootstrap sequences of the individual phases are started at 3 different time instants. A sequence for a particular phase is started at the negative zero crossing of the corresponding back-EMF. This gives a 120° displacement between each bootstrap sequence. Below 50% of rated motor frequency the bootstrap sequences are to be executed at the same time and in phase, without being synchronized to the back-EMF system.

As another example for a rated motor frequency=50-150 Hz, the 1 ms bootstrap sequences of the individual phases are started at 2 different time instants. The 2 first sequences of 2 particular phases are started, when the corresponding back-EMFs cross, while both being negative. The last sequence is started 90° later, at the negative-going zero crossing of the back-EMF of the last phase. Below 50% of rated motor frequency the bootstrap sequences are to be executed at the same time and in phase, without being synchronized to the back-EMF system.

A third example is for a rated motor frequency <50 Hz, where it is difficult to bootstrap by the sequence as in the example of a rated motor frequency=50-150 Hz., being optimized for minimization of the time between the 2 initiation instants, because 90° at 50% rated speed is more than 10 ms. This is the maximum desired hold-up time of the bootstrap capacitors. The compromise is to execute the bootstrap sequence of the last phase 10 ms after the execution of the 2 first sequences always, if a negative-going zero crossing was not detected within this 10 ms time frame. This will violate the 50% rated-speed criteria for asynchronous bootstrap charging more and more as the rated motor frequency goes low.

Although various embodiments of the present invention have been described and shown, the invention is not restricted thereto, but may also be embodied in other ways within the scope of the subject-matter defined in the following claims.

What is claimed is:

1. A method of recharging a controller with inoperative switching elements comprising a bootstrap capacitor and having at least two output phases, the controller being connected to a load generating back-EMFs at the output terminals of the controller, wherein the load is a motor and the controller is a motor controller, the method comprising a recharge sequence for the bootstrap capacitor of each output phase, and selecting each recharge sequence from a set of at least two recharge sequences in relation to or as a function of the back-EMFs of the load, where the choice is based on the spinning of the load in relation to a base frequency, or alternatively the amplitude of the back-EMFs in relation to a base amplitude of the back-EMFs.

2. The method according to claim 1, wherein the recharging sequences are bootstrap-charging processes.

3. The method according to claim 1, wherein the back-EMF is caused by a spinning motor.

4. The method according to claim 1, wherein the motor is a three-phase motor, the motor controller thus being a three-phase motor controller.

5. The method according to claim 1, wherein the set of recharging sequences comprises a high-frequency zone, defined as when the motor spins above an upper threshold level.

6. The method according to claim 5, wherein the set of recharging sequences comprises a low-frequency zone, defined as when the motor spins below a lower threshold level, the lower threshold level possibly being the same as the upper threshold level.

7. The method according to claim 6, wherein the set of recharging sequences further comprises a medium-frequency zone, defined as being below the upper threshold level and/or above the lower threshold level.

8. The method according to claim 1, wherein a first sequence of the set of sequences is to initiate the recharging process of all three phases essentially at the same time.

9. The method according to claim 1, wherein a second sequence in the set of sequences is to initiate the recharging process of two phases essentially at the same time, when they both are negative, optionally at the zero crossing point of one of the two phases, or when they are both lower than a recharge-threshold level, or when they cross having similar negative back-EMF values, the recharging process of third phase then being initiated at its zero-crossing region or when under a recharge-threshold level.

10. The method according to claim 1, wherein a third sequence in the set of sequences is initiation of the charging process of all three phases in succession, when they have negative back-EMF values respectively, optionally at their zero-crossing point or below a recharge threshold level.

11. The method according to claim 10, wherein the first sequence corresponds to the low-frequency zone, the second sequence corresponds to the medium-frequency zone and the third sequence corresponds to the high-frequency zone, and where the set of sequences comprises at least two of the first, second and third sequences.

12. A motor controller including the method according to claim 1.

13. A device including the method according to claim 1.

14. A method to re-start an electric motor, where the motor is re-started subsequently to the bootstrap capacitors of the controller having been recharged according to the recharging process of claim 1.

* * * * *